United States Patent [19]

Yamada et al.

[11] Patent Number: 5,045,484

[45] Date of Patent: Sep. 3, 1991

[54] FABRICATION METHOD OF A BIMOS SEMICONDUCTOR DEVICE

[75] Inventors: Shinichi Yamada; Tunenori Yamauchi, both of Kawasaki, Japan

[73] Assignee: Fujitsu Limited, Kawasaki, Japan

[21] Appl. No.: 553,389

[22] Filed: Jul. 17, 1990

[30] Foreign Application Priority Data

Jul. 17, 1989 [JP] Japan .................................. 1-184186

[51] Int. Cl.[5] .................. H01L 21/331; H01L 21/336
[52] U.S. Cl. ........................................ 437/31; 437/59; 437/162; 437/228; 437/231; 148/DIG. 9
[58] Field of Search ........................ 437/31, 33, 56, 57, 437/58, 59, 162, 228, 229, 231; 357/34, 43; 148/DIG. 9

[56] References Cited

U.S. PATENT DOCUMENTS

| | | | |
|---|---|---|---|
| 4,721,548 | 1/1988 | Morimoto | 437/228 |
| 4,753,709 | 6/1988 | Welch et al. | 156/643 |
| 4,829,025 | 5/1989 | Iranmanesh | 437/228 |
| 4,902,640 | 2/1990 | Sachitano et al. | 437/162 |
| 4,931,407 | 6/1990 | Maeda et al. | 437/45 |

OTHER PUBLICATIONS

Chiu, T. Y., et al., IEEE Electron Device Letters, vol. 11, No. 2, Feb. 1990, pp. 85–86.
Takemura, H., et al., IEEE IEDM Technical Digest, 1987, pp. 375–378.
Gomi, T., et al., IEEE IEDM Technical Digest 1988, pp. 744–747.

Primary Examiner—Brian E. Hearn
Assistant Examiner—T. N. Quach
Attorney, Agent, or Firm—Staas & Halsey

[57] ABSTRACT

A method for fabricating a BIMOS device includes steps of forming a first insulator layer on the semiconductor layer in correspondence to a first region, providing a gate electrode of a metal-insulator-semiconductor transistor on the first insulator layer, and providing a base electrode of a bipolar transistor on a second region of the semiconductor layer. The method also includes introducing impurities into the semiconductor layer in the first region using the gate electrode as a mask to form self-aligned source and drain regions, introducing impurities into the base electrode and causing a diffusion of the impurities into the semiconductor layer to form a base region in the second region. Also included are steps of providing a second insulator layer so as to cover the first region and the second region, providing an insulator material on the second insulator in the form of liquid and curing subsequently to form a third insulator layer on the second insulator layer with a planarized top surface. A through hole is provided in the second insulator layer such that the through hole penetrates at least through the second insulator layer and the base electrode to expose a top surface of the semiconductor layer. An emitter region of the bipolar transistor is formed in the second region of the semiconductor layer. Interconnection electrodes for interconnection of the semiconductor device are also provided.

6 Claims, 12 Drawing Sheets

FABRICATION METHOD OF A BIMOS SEMICONDUCTOR DEVICE

BACKGROUND OF THE INVENTION

The present invention generally relates to fabrication of semiconductor devices and more particularly to a method for fabricating a semiconductor device wherein a bipolar transistor and a metal-insulator-semiconductor (MIS) transistor are provided on a same substrate.

With the demand for high speed semiconductor devices having a large integration density, semiconductor devices including bipolar transistors with the self-aligned emitter-base structure and metal-oxide-semiconductor (MOS) transistors on a same substrate are marketed. Such semiconductor devices provide a preferable feature as a result of combination of the characteristically small parasitic capacitance of the bipolar transistors and the characteristically low power consumption of the MOS transistors.

When fabricating such a semiconductor device wherein semiconductor devices of different type are provided on a same substrate, fabrication of the semiconductor device of each type is made concurrently so as to improve the efficiency of production. In such a process of fabrication, it is desired to form the surface of the semiconductor device flat so that the formation of steps, which may cause the disconnection of interconnection conductor patterns provided on the surface of the semiconductor device, is suppressed or eliminated.

FIGS. 1A-1J show the fabrication steps of a conventional semiconductor device of the foregoing type.

Figure 1A:
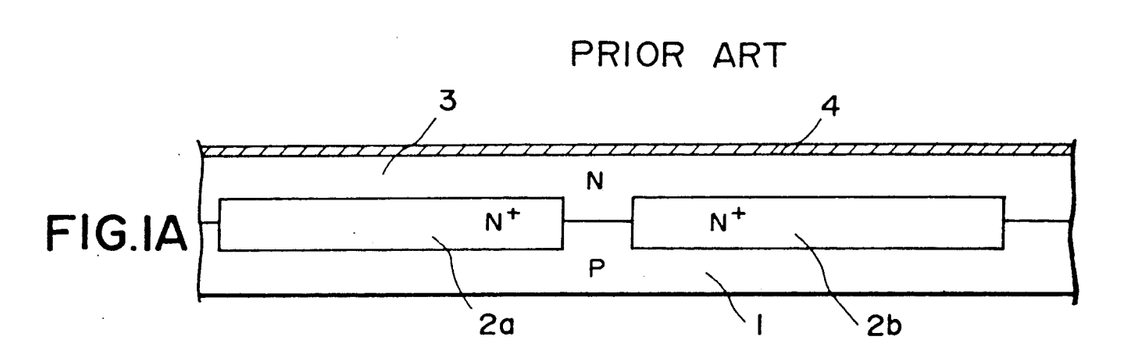
FIGS. 1A–1L are diagrams showing the conventional process for fabricating a semiconductor device having a MOS transistor and a bipolar transistor on a common substrate.
Figure 1B:
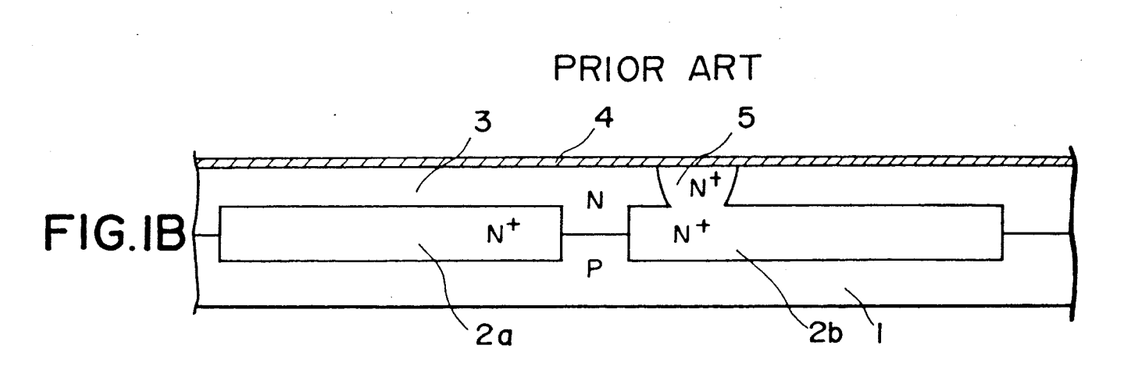
Figure 1C:
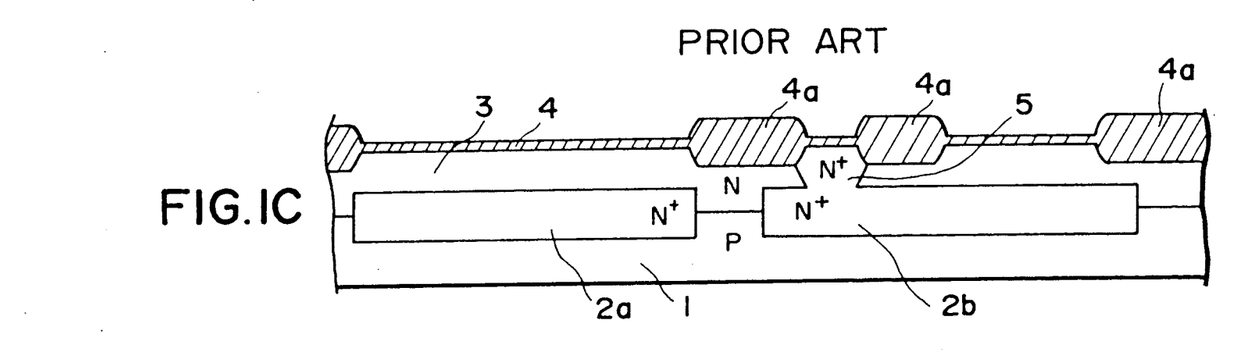
Figure 1D:
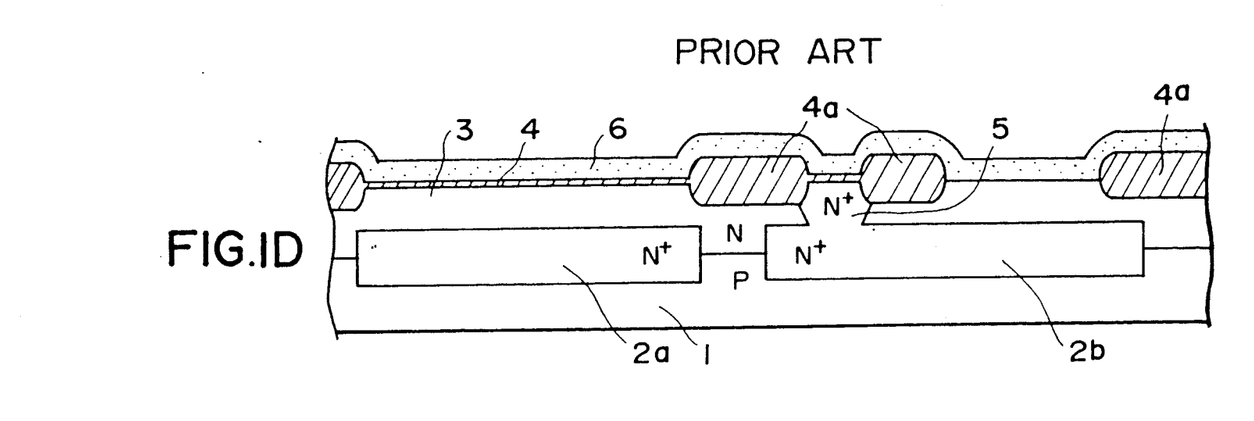
Figure 1E:
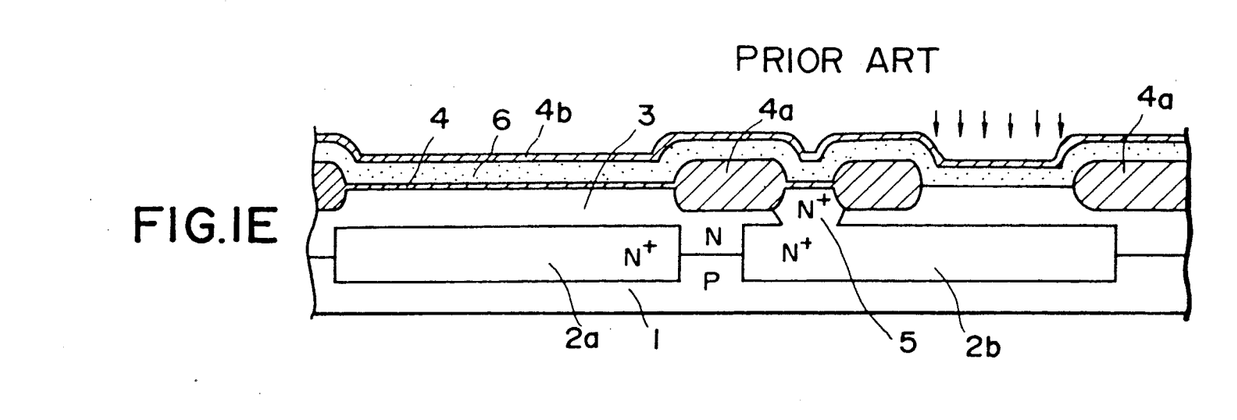
Figure 1F:
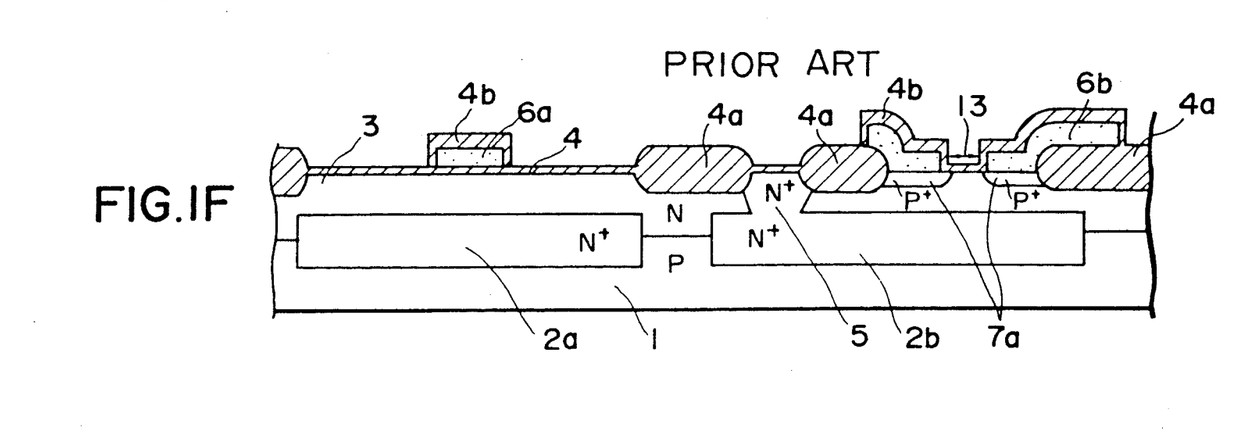
Figure 1G:
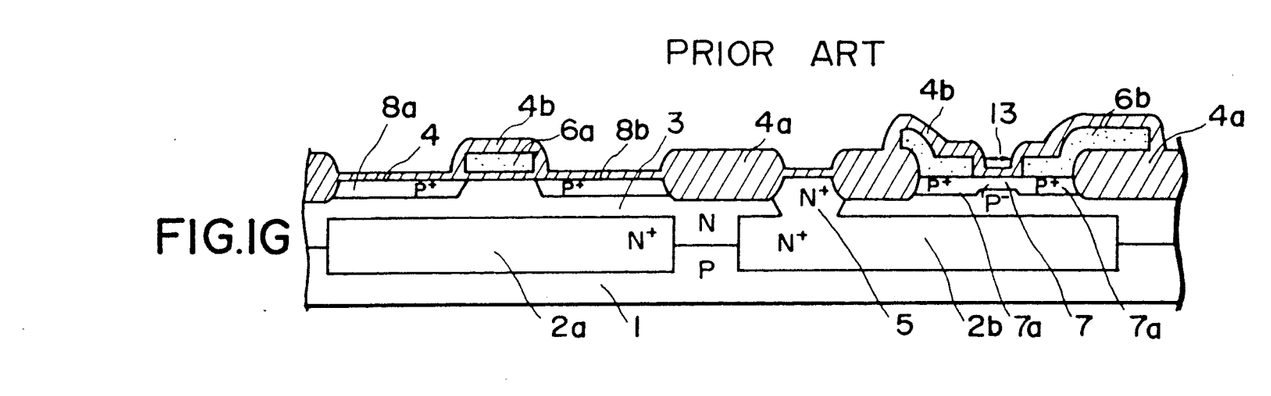
Figure 1H:
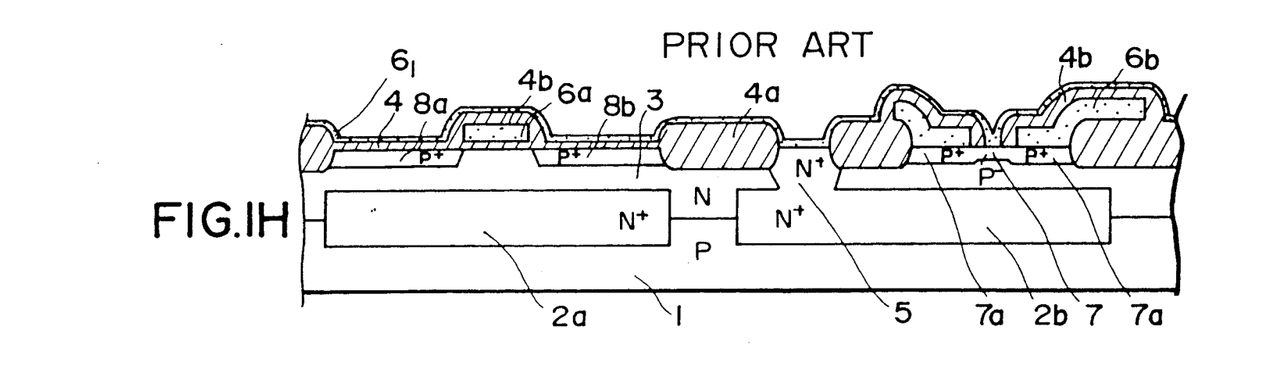
Figure 1I:
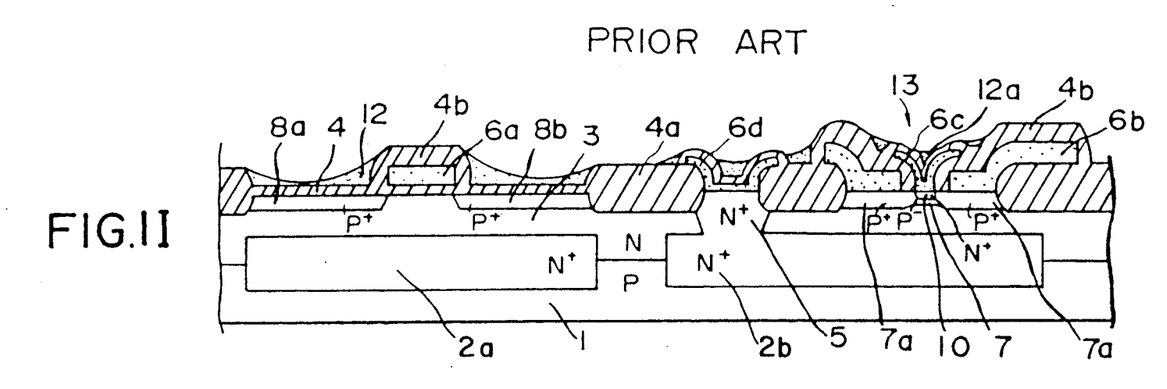
Figure 1J:
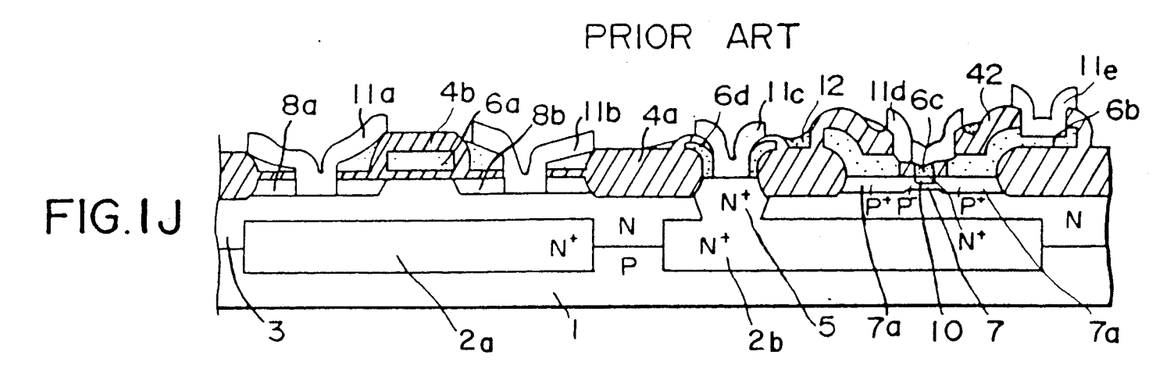

Referring to FIG. 1J showing the completed semiconductor device at first, the semiconductor device comprises a silicon substrate 1 of the p-type, an epitaxial layer 3 of the n-type silicon grown on the substrate 1, a pair of buried layers 2a and 2b of the n+-type formed at a boundary between the substrate 1 and the epitaxial layer 3 respectively in correspondence to a MOS transistor and a bipolar transistor formed commonly on the substrate 1, the buried layer 2b thereby acting as the buried collector of the bipolar transistor, an n+-type emitter region 10 formed in correspondence to the surface of the epitaxial layer 3 as the emitter of the bipolar transistor, a base region 7 of the p−-type formed in the epitaxial layer 3 underneath the emitter region 10 as the base of the bipolar transistor, an outer base region 7a of the p+-type formed in the epitaxial layer 3 so as to surround the inner base region 7 laterally, a diffusion region 8a of the p+-type formed in the epitaxial layer 3 as the source region of the MOS transistor, a diffusion region 8b of the p+-type formed in the epitaxial layer 3 as the drain region of the MOS transistor, an insulator film 4 provided on the top surface of the epitaxial layer 3 in correspondence to the MOS transistor as the gate insulation film, an isolation region 4a of an insulator material same as the material forming the insulator film 4 for isolating the MOS transistor and the bipolar transistor from each other, a collector contact region 5 formed in the epitaxial layer 3 in correspondence to the bipolar transistor so as to extend from the surface of the layer 3 to the buried layer 2b, a polysilicon gate electrode 6a provided on the insulator film 4 as the gate of the MOS transistor, a polysilicon base electrode 6b provided on the epitaxial layer 3 in contact with the outer base region 7a, and a polysilicon emitter electrode 6c provided in contact with the emitter region 10 and separated from the base electrode 6b by a second insulator film 4b.

Next, the problems of the conventional semiconductor device addressed by the present invention will be explained with reference to the fabrication process shown in FIGS. 1A-1J.

In a step of FIG. 1A, the insulator film 4 of silicon oxide is grown on the silicon epitaxial layer 3 which is provided on the silicon substrate 1 with the buried layers 2a and 2b formed between the substrate 1 and the epitaxial layer 3. The insulator film 4 may be a layer of silicon oxide formed by the thermal oxidation process.

In a step of FIG. 1B, an ion implantation is made through the insulator film 4 in correspondence to where the collector contact region is to be formed and after an annealing process performed subsequent to the ion implantation, the collector contact region 5 of the n+-type is formed as illustrated.

In a step of FIG. 1C, the device isolation structure 4a is formed by applying an oxidation process selectively so as to separate the region of the epitaxial layer 3 on which the MOS transistor is to be formed from the region on which the bipolar transistor is to be formed. It should be noted that the region of the epitaxial layer 3 where the collector contact region 5 is formed is covered by the thin insulator film 4.

In a step of FIG. 1D, a first polysilicon layer 6 is deposited uniformly on the insulator layer 4 including the isolation structure 4a as illustrated, and the second insulator film 4b is formed on the polysilicon layer 6 in a next step of FIG. 1E. Further, an ion implantation process is performed in the step of FIG. 1E wherein the p+-type outer base region 7a of the bipolar transistor is formed.

In a step of FIG. 1F, the first polysilicon layer 6 as well as the second insulator film 4b are patterned and thereby the gate electrode 6a and the base electrode 6b are formed. Further, a contact hole 13 is formed through the base electrode 6b, and the exposed side surfaces of the gate electrode 6b and the contact hole 13 are oxidized. As a result, the second insulator film 4b at the top of the gate electrode 6a is connected to the first insulator film by the oxide film formed at the side walls of the gate electrode 6b. At the same time, the surface of the epitaxial layer 3 exposed at the bottom of the contact hole 13 is covered by an oxide film.

In a step of FIG. 1G, the thickness of the insulator films 4 and 4b including the side wall of the gate electrode 6a and the contact hole 13 of the structure of FIG. 1F is increased by growing the insulator film further and the insulator film 4b covering the top surface of the gate electrode 6a and the base electrode 6b as well as the insulator film 4 covering the epitaxial layer 3 is selectively etched by applying an anisotropic etching process acting vertically to the major surface of the epitaxial layer 3. Thereby, the a thick oxide is remained at the side surface of the gate electrode 6a and at the side wall of the contact hole 13. Next, an ion implantation process is carried out to the epitaxial layer 3 at both sides of the gate electrode 6a, and thereby the source region 8a and the drain region 8b are formed as illustrated. As the same time, the ion implantation is made also through the contact hole 13 and thereby the inner base region 7 is formed in the epitaxial layer 3.

In a step of FIG. 1H, the thickness of the oxide at the side surface of the gate electrode 6a and at the side wall of the contact hole 13 is increased by growing the insulator film on the structure of FIG. 1G and by applying the anisotropic etching as already described with reference to the step of FIG. 1G. Thereby, the diameter of the contact hole 13 is reduced. Further, the insulator film is removed from the bottom of the contact hole 13 and also from the part of the epitaxial layer 3 wherein the collector contact 5 is formed. Further, a second polysilicon layer $6_1$ is deposited on the entire surface of the structure thus formed, and implantation of impurities is made into the layer $6_1$. The impurity elements thus introduced are diffused into the epitaxial layer 3 immediately in contact with the electrode 6c in the subsequent heat treatment.

In a step of FIG. 1I, the second polysilicon layer $6_1$ is patterned to form the electrode 6c for the emitter and the electrode 6d for the collector of the bipolar transistor. Further, a CVD process is carried out such that the the entire surface of the structure thus formed is covered by the oxide film forming the second insulator film 4b. As a result of the heat treatment which is accompanied with the CVD process, the impurity elements in the electrode 6c are diffused into the epitaxial layer 3 immediately in contact with the electrode 6c and the emitter region 10 is formed in the surface part of the base region 7.

Next, a liquid insulator material commonly known as spin-on-glass (SOG) is applied on the oxide film by a spin coating process. Thereby, any depression formed on the structure is filled by an SOG layer 12 as shown in FIG. 1I, and the unwanted steps on the surface of the device which tend to cause the disconnection of the interconnection conductors are smoothed. After the layer 12 is applied, the layer 12 is cured by a heat treatment process which is carried out at a relatively low temperature typically of about 800° C. When the layer 12 is applied, the SOG has a low viscosity and a planarized surface suitable for providing interconnection thereon is obtained at the top surface of the semiconductor device.

After the layer 12 is cured, contact holes are provided in correspondence to the source, gate and drain of the MOS transistor and in correspondence to the collector, emitter and base of the bipolar transistor. Further, an interconnection conductor is deposited and patterned in correspondence to the contact holes. Thereby, the completed device structure having interconnection electrodes 11a–11e is obtained as shown in FIG. 1J.

According to the present structure, the risk that the interconnection conductors on the top surface of the device connecting the electrodes 11a–11e is damaged is significantly reduced by the planarized top surface, and the improved yield as well as the reliability of the semiconductor device are expected.

Figure 1K:
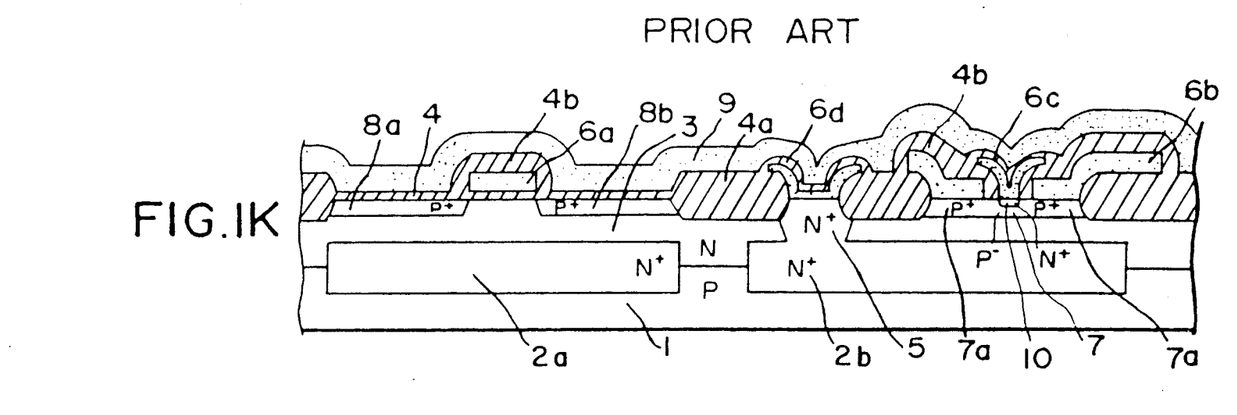
Figure 1L:
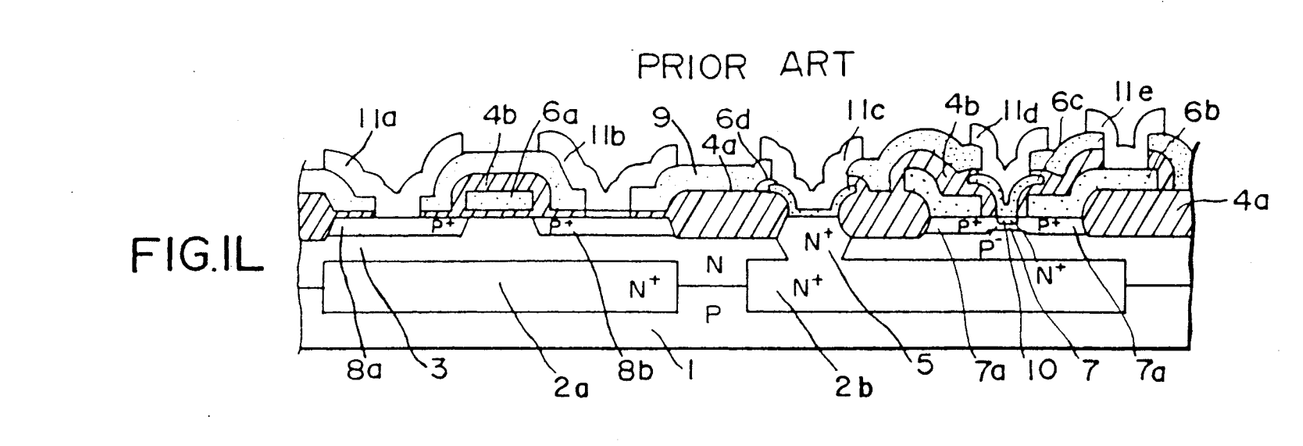

Alternatively, the semiconductor device may be covered by a phosphosilicate glass (PSG) layer 9 as shown in FIG. 1K. In this case, the PSG layer 9 is deposited on the second insulator film 4b after the step of forming the emitter and collector electrodes 6c and 6d are formed and the oxide layer grown on the electrodes 6c and 6d. This PSG layer 9 is heat treated subsequently at a temperature of typically 1100° C. to cause reflowing, and thereby a planarized surface is obtained at the top surface of the semiconductor device as shown in FIG. 1K. Further, the contact holes are formed in correspondence to the source and drain electrodes of the MOS transistor and in correspondence to the collector, emitter and base of the bipolar transistor, and the electrodes 11a–11e are provided in correspondence to the foregoing contact holes as shown in FIG. 1L. In this structure, too, the top surface of the semiconductor device is planarized and the improved yield and reliability of the device are expected.

In the foregoing process, particularly the one using the SOG for planarization of the device explained with reference to FIGS. 1A–1J, there arises a problem in that the second insulator film 4b may be etched excessively when forming the contact hole for the electrode 11d for the emitter region 10 of the bipolar transistor. More specifically, there appears a deep depression in the second insulator film 4b in conformance with the shape of the contact hole 13 as shown in FIG. 1I when the layer 4b is grown, and this depression is inevitably filled by the SOG which is shown in FIG. 1I by a reference numeral 12a. When providing the electrode 11d in contact with the emitter electrode 6c which is buried under the insulator film 4b which in turn is buried under the SOG 12a filling the depression, a deep etching is needed in order to remove the thick SOG layer 12a and expose the top surface of the emitter electrode 6c. When the ething is applied to form such a deep contact hole, there arises a risk that the polysilicon base electrode 6b is exposed by the contact hole and makes a contact with the electrode 11a as shown in FIG. 1J. Further, such an etching, used to form the contact hole for the electrode 11d, is used simultaneously to form the contact holes for the interconnection electrodes 11a and 11b for the source and drain of the MOS transistor. As the insulator film 4 covering the source region 8a or drain region 8b of the MOS transistor is thin even considering the thickness of the SOG layer 12 thereon, there is a substantial risk that the source and drain regions 8a and 8b are etched excessively as illustrated in FIG. 1J and the characteristic of the device is significantly deteriorated. Further, the use of thin insulator layer 4 raises a problem in that the insulator film may be easily damaged in response to the current flowing through the electrode 11a or 11b. When this occurs, the reliability of the semiconductor device is seriously deteriorated.

In the case of the process including the steps of FIGS. 1K and 1L wherein the reflowing of PSG is used, on the other hand, there arises another problem in that the emitter region 10, formed as a result of diffusion of impurity elements from the emitter electrode 6c into the base region 7, may grow excessively and reach the collector region 3 of the bipolar transistor underneath the base region 7. Such an excessive diffusion may occur due to the relatively high temperature of heat treatment needed for the reflowing of PSG. A similar problem occurs also in the MOS transistor such that the source region 8a and the drain region 8b are grown excessively by the diffusion of the impurity elements in response to the heat treatment and may become continuous particularly when the gate length is reduced. Such excessive growth of the diffusion region is detrimental to the operation of the MOS transistor as well as bipolar transistor. In order to avoid these problems. the conventional semiconductors have to be designed to have a relatively large gate length and a relatively large base thickness. However, increase in the gate length and increase in the base thickness both contribute to the decrease of the operational speed of the transistors. Thus, the semiconductor devices produced in accordance with the foregoing process had the problem of unsatisfactory operational speed in addition to the problem of poor reliability.

From the view point of achieving an excellent operational speed for the bipolar and the MOS transistors, it is essential to use the SOG at the time of planarization and prevent the excessive diffusion of impurities such that the gate length and the base thickness are reduced. Therefore, a process of fabricating the device wherein the foregoing problems are eliminated while still allowing for the use of the SOG for the planarization of the device is strongly demanded.

SUMMARY OF THE INVENTION

Accordingly, it is a general object of the present invention to provide a novel and useful process for fabricating a semiconductor device wherein the problems aforementioned are eliminated.

Another object of the present invention is to provide a process for fabricating a reliable semiconductor device wherein a bipolar transistor and a metal-insulator-semiconductor transistor are provided on a common substrate, and wherein the semiconductor device has a planarized top surface achieved by an insulator layer which is applied in a form of liquid and cured subsequently.

Another object of the present invention is to provide a process for fabricating a semiconductor device including a metal-insulator-semiconductor transistor and a bipolar transistor on a common semiconductor layer respectively in correspondence to a first region and a second region defined on the semiconductor layer, said semiconductor layer being formed with a collector structure acting as the collector of the bipolar transistor in the second region, said collector structure including a collector contact region exposed at a top surface of the semiconductor layer, comprising the steps of: forming a first insulator layer on the semiconductor layer in correspondence to the first region; providing a gate electrode of the metal-insulator-semiconductor transistor on the first insulator layer in correspondence to the first region of the semiconductor layer; providing a base electrode on the second region of the semiconductor layer; introducing impurities into the semiconductor layer in the first region using the gate electrode as a mask to form a source region and a drain region in the semiconductor layer at both sides of the gate electrode; introducing impurities into the base electrode and causing a diffusion of the impurities into the semiconductor layer from the base electrode to form a base region in the second region of the semiconductor layer; providing a second insulator layer so as to cover the first region including the source region, the gate electrode and the drain region, and the second region including the base electrode; providing an insulator material on the second insulator in the form of liquid and curing subsequently to form a third insulator layer on the second insulator layer with a planarized top surface; providing a through hole in the second insulator layer in correspondence to the second region of the semiconductor layer, after the step of providing the insulator material forming the third insulator layer, such that the through hole penetrates at least through the second insulator layer and the base electrode to expose a top surface of the semiconductor layer; forming an emitter region of the bipolar transistor in the second region of the semiconductor layer in correspondence to the top surface of the semiconductor layer exposed by the through hole; and providing interconnection electrodes in correspondence to the source region and the drain region of the MOS transistor and further in correspondence to the collector contact region, the base region and the emitter region of the bipolar transistor. According to the present invention, the through hole for the emitter region is provided after the step of planarization. Therefore, the filling of the through hole by the liquid insulator material at the time of planarization as in the case of the conventional device does not occur, and the interconnection electrode for the emitter can be provided without applying the etching process for removing the insulator material from the through hole. Thereby, the risk that the interconnection electrode provided on the emitter region may contact with the base electrode due to the excessive etching as in the case of the conventional process (see FIG. 1J) is eliminated. Further, the thickness of the insulator layers formed on the second insulator layer is more or less the same in the location where the interconnection electrodes for the source region and the drain region of the MOS transistor are formed and in the location where the interconnection electrodes for the collector electrode and the base electrode of the bipolar transistor are formed. Thereby, the contact hole provided through the first through third layer for the interconnection electrodes have a depth more or less the same and can be formed simultaneously in a single step of etching without any risk to damage the diffusion region underneath. Furthermore, the overall thickness of the insulator layers on the semiconductor layer through which the interconnection electrodes are provided is substantially increased as compared to the conventional device and the risk that the insulation may be damaged in the vicinity of the interconnection electrodes in response to the electric current flowing through the interconnection electrodes is substantially reduced. Thereby, a semiconductor device having an improved reliability is obtained.

Other objects and further features of the present invention will become apparent from the following detailed description when read in conjunction with attached drawings.

DETAILED DESCRIPTION

Next, the present invention will be described with reference to FIGS. 2A–2L showing an embodiment of the present invention.

Figure 2A:
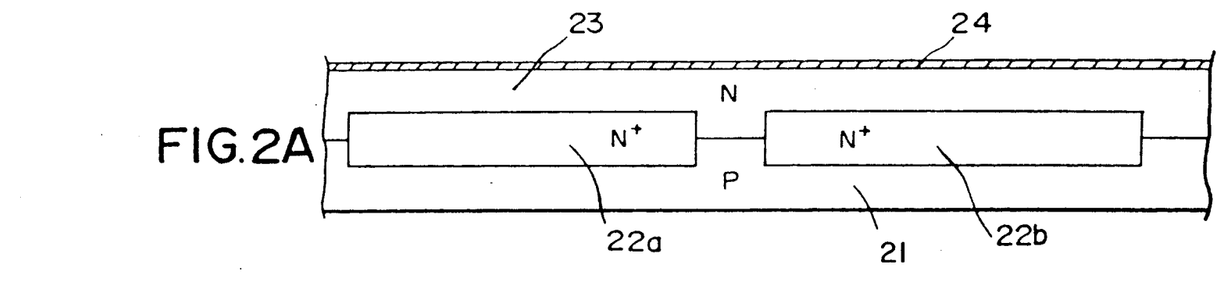
FIGS. 2A–2L are diagrams showing the process for fabricating the semiconductor device according to an embodiment of the present invention.
Figure 2B:
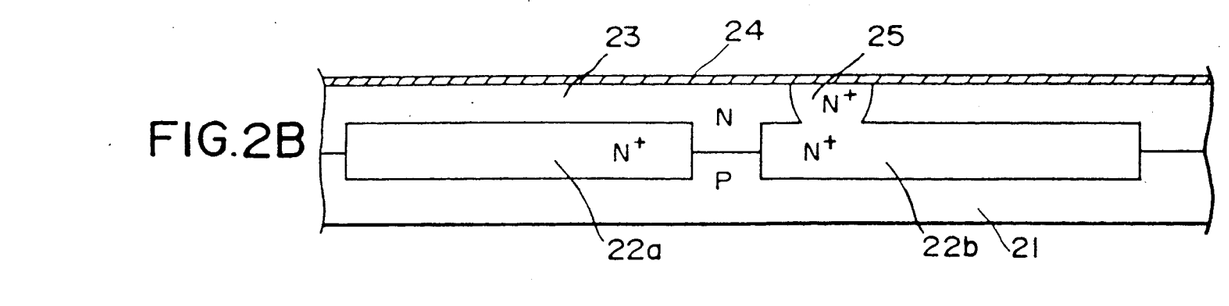
Figure 2C:
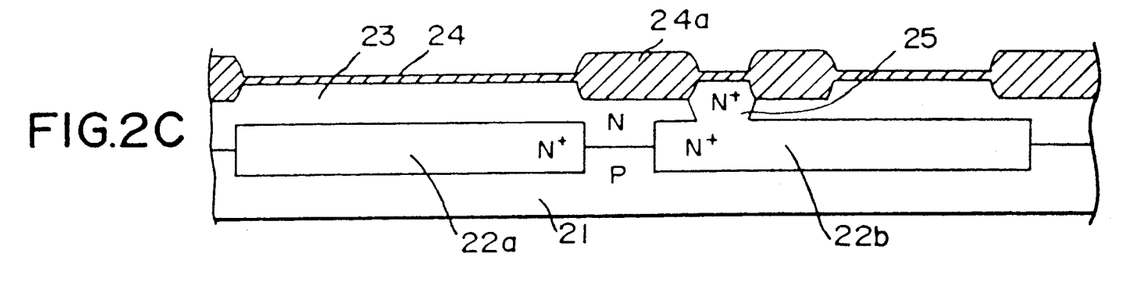
Figure 2D:
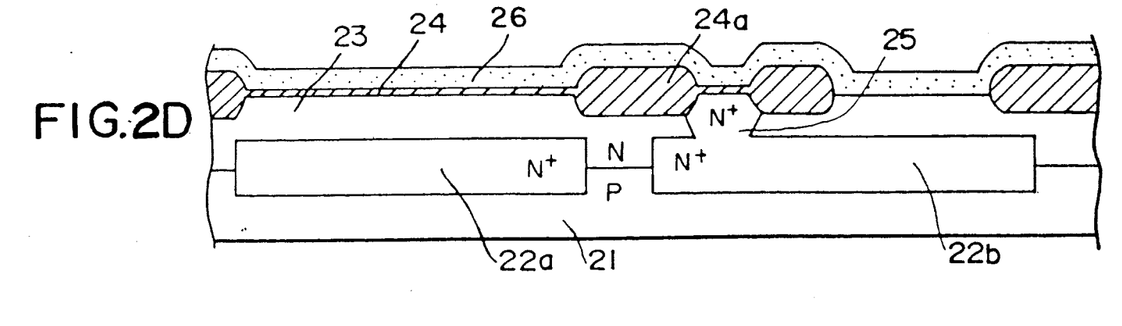
Figure 2E:
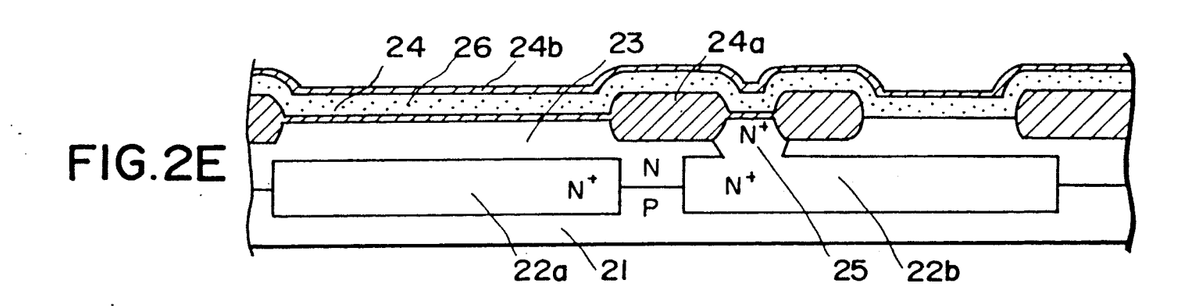
Figure 2F:
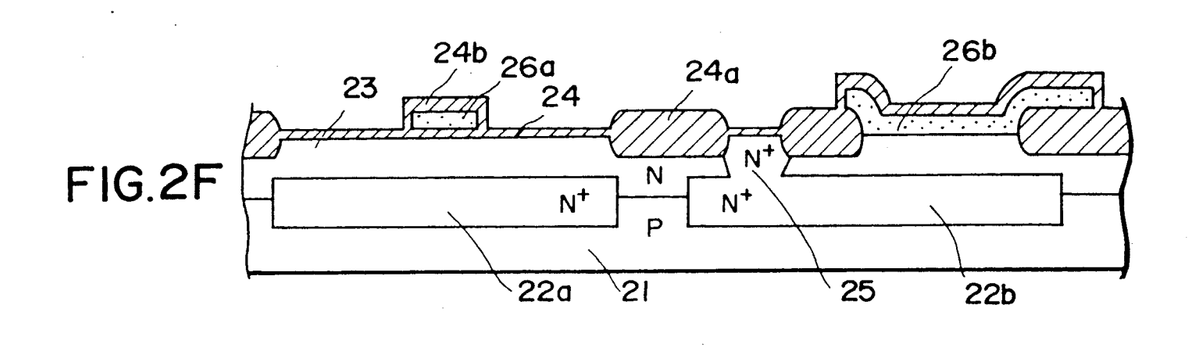
Figure 2G:
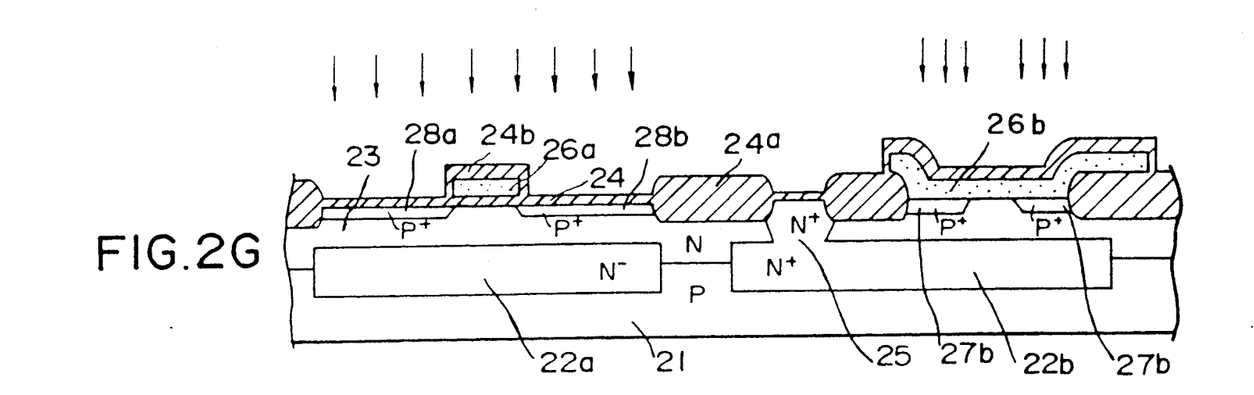
Figure 2H:
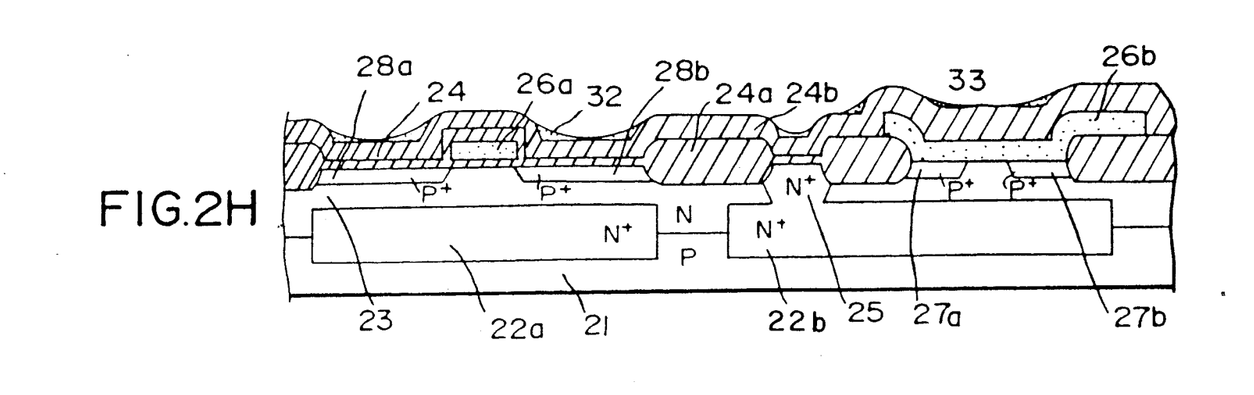
Figure 2I:
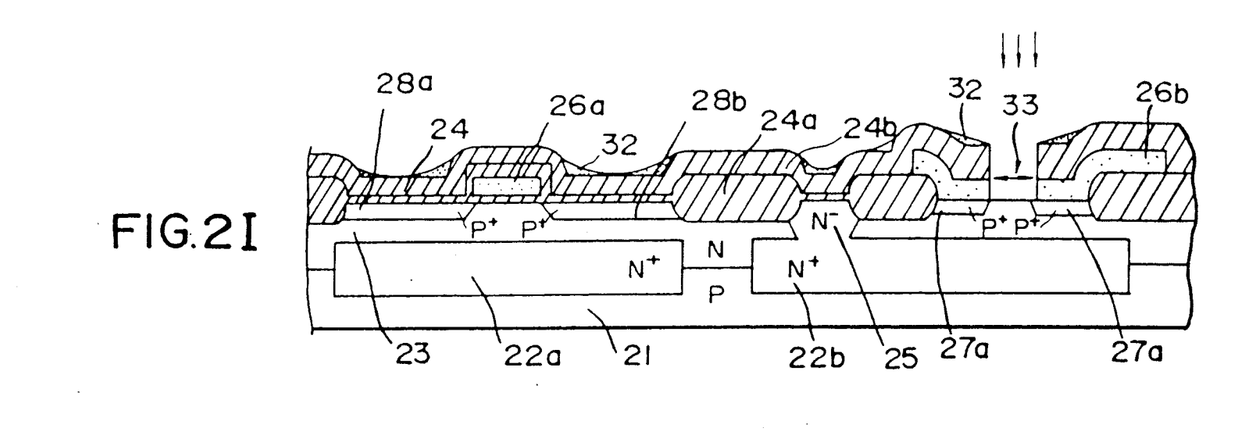
Figure 2J:
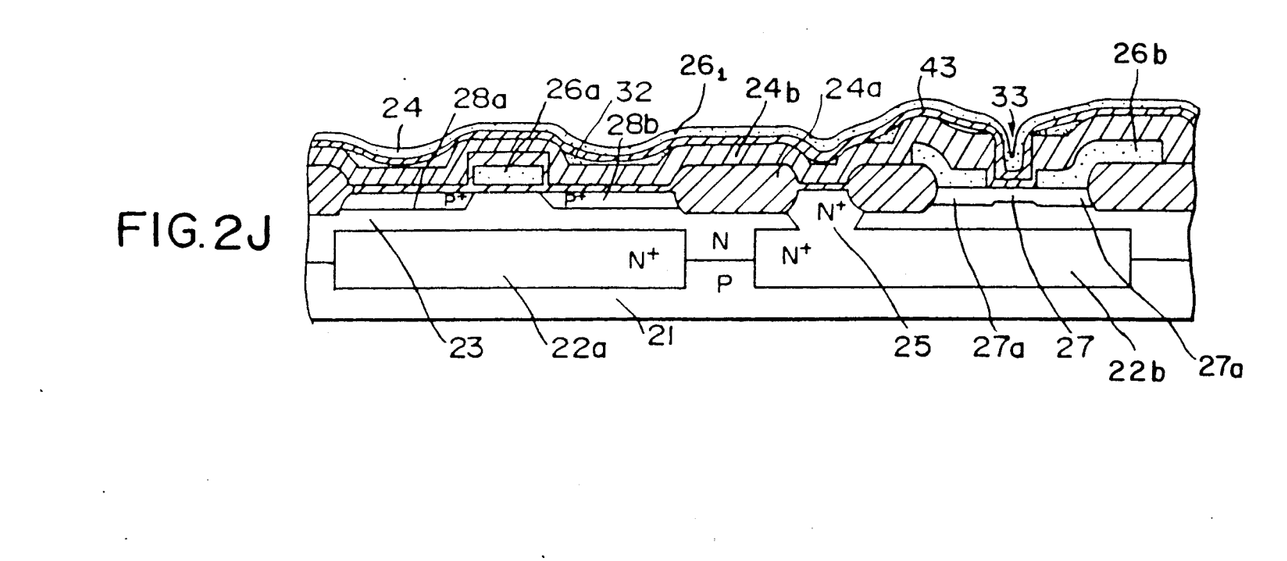
Figure 2K:
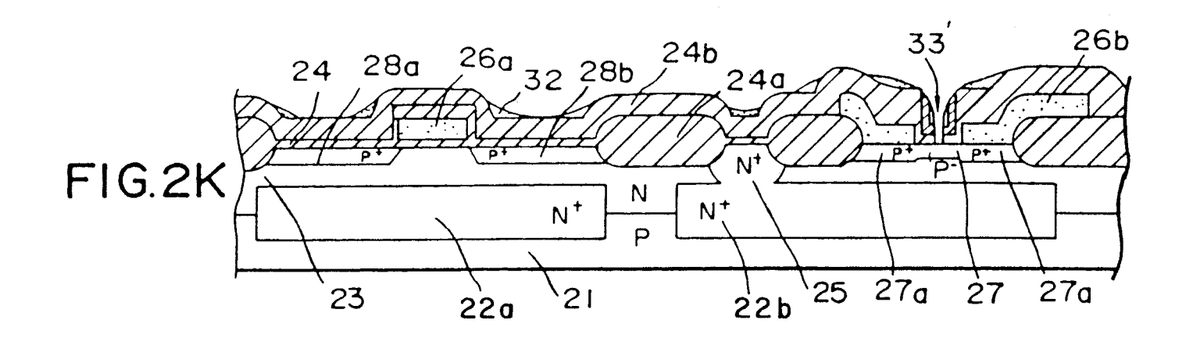
Figure 2L:
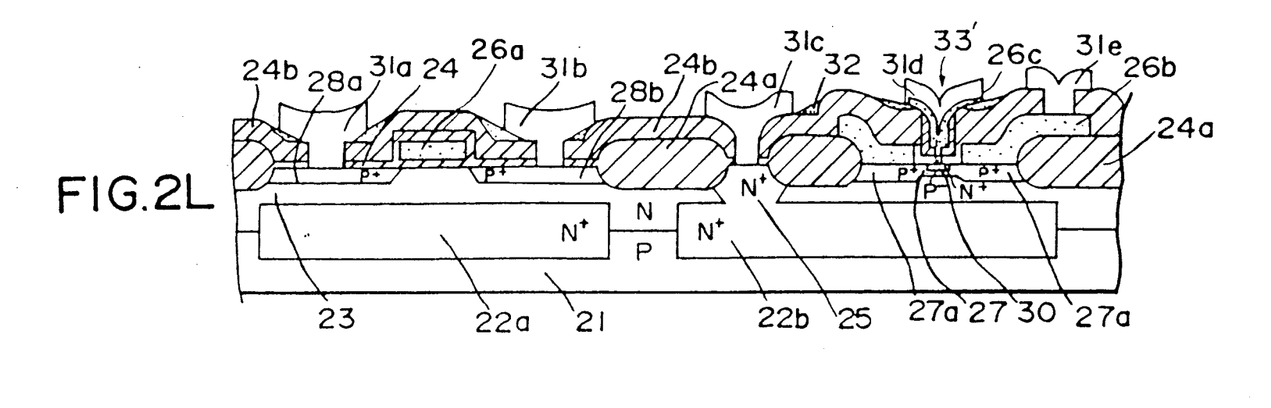

Referring to FIG. 2L showing the completed semiconductor device at first, the semiconductor device comprises a silicon substrate 21 of the p-type, an epitaxial layer 23 of silicon doped to the n-type and grown on the substrate 21, a pair of buried layers 22a and 22b of the n$^+$-type formed at a boundary between the substrate 21 and the epitaxial layer 23 respectively in correspondence to a MOS transistor and a bipolar transistor formed commonly on the substrate 21, the buried layer 22b acting as the buried collector of the bipolar transistor, and n$^+$-type emitter region 30 formed in correspondence to the surface of the epitaxial layer 23 as the emitter of the bipolar transistor, an inner base region 27 of the p$^-$-type formed in the epitaxial layer 23 underneath the emitter region 30 as the base of the bipolar transistor, an outer base region 27a of the p$^+$-type formed in the epitaxial layer 23 so as to surround the inner base region 27 laterally, a diffusion region 28a of the p+-type formed in the epitaxial layer 23 as the source region of the MOS transistor, a diffusion region 28b of the p+-type formed in the epitaxial layer 23 as the drain region of the the MOS transistor, an insulator film 24 of silicon oxide provided on the top surface of the epitaxial layer 23 in correspondence to the MOS transistor as the gate insulation film with a thickness of 300Å, an isolation region 24a of an insulator material same as the material forming the insulator film 24 for isolating the MOS transistor and the bipolar transistor from each other, a collector contact region 25 formed in the epitaxial layer 23 in correspondence to the bipolar transistor so as to extend from the surface of the layer 23 to the buried layer 22b, a polysilicon gate electrode 26a provided on the insulator film 24 as the gate of the MOS transistor, a polysilicon base electrode 26b provided on the epitaxial layer 23 in contact with the outer base region 27a, and a polysilicon emitter electrode 26c provided in contact with the emitter region 30 and separated from the base electrode 26b by a second insulator film 24b. The second insulator film 24b may be a silicon oxide film and formed on the first insulator film 24. Further, interconnection electrodes 31a–31e are provided respectively in correspondence to the source region 28a, the drain region 28b, the collector contact 25, the emitter electrode 26c, and the base electrode 26b via respective contact holes. It should be noted that the emitter electrode 26c is provided within the contact hole for the interconnection electrode 31d between the electrode 31d and the emitter region 30.

Next, the process for fabricating the semiconductor device of FIG. 2J according to an embodiment of the present invention will be described with reference to the fabrication process shown in FIGS. 2A–2J.

In a step of FIG. 2A, the insulator film 24 of silicon oxide is grown with a thickness of about 300Å by a thermal oxidation process on the silicon epitaxial layer 23 which is provided on the silicon substrate 21 with the buried layers 22a and 22b formed between the substrate 21 and the epitaxial layer 23.

In a step of FIG. 2B, an ion implantation of impurities such as phosphorus or arsenic is made through the insulator film 4 in correspondence to where the collector contact region is to be formed and after the annealing process performed subsequent to the ion implantation, the collector contact region 25 of the n+-type is formed as illustrated.

In a step of FIG. 2C, the device isolation structure, 24a is formed by applying an oxidation process such as the wet oxidation process selectively so as to separate the region of the epitaxial layer 23 on which the MOS transistor is to be formed from the region on which the bipolar transistor is to be formed. It should be noted that the region of the epitaxial layer 23 where the collector contact region 25 is formed is covered by the thin insulator film 24.

In a step of FIG. 2D, a first polysilicon layer 26 is deposited uniformly on the insulator layer 24 including the isolation structure 24a as illustrated by a CVD process with a thickness of 3000Å, and the second insulator film 24b of silicon oxide is deposited on the polysilicon layer 26 in a next step of FIG. 1E with a thickness of about 300Å by a CVD process.

In a step of FIG. 2F, the first polysilicon layer 26 as well as the second insulator film 24b are patterned and thereby the gate electrode 26a and the base electrode 26b are formed. The exposed side walls of the patterned gate electrode 26a and the base electrode 26b are covered by silicon oxide deposited by a CVD process or formed by a thermal oxidation process, and thereby a structure as shown in FIG. 2F is obtained. In this structure, the insulator film 24 and the insulator film 24b are connected by the silicon oxide formed at the side walls of the gate electrode 26a and the base electrode 26b.

In a step of FIG. 2G, the ion implantation of impurities such as boron is conducted into the base electrode 26b in correspondence to the outer base region 27a of the bipolar transistor. The impurities thus introduced into the base electrode 26b are diffused into the epitaxial layer 23 in response to the heat treatments applied subsequently and form the outer base region 27a as shown in FIG. 2G. At the same time, the ion implantation is performed also into the epitaxial layer 23 corresponding to the MOS transistor, and thereby the source region 28a and the drain region 28b are formed in the self-aligned relationship with respect to the gate electrode 26c.

In a step of FIG. 2H, the thickness of the insulator film 24b is increased by depositing silicon oxide further by repeating the CVD process such that the insulator film 24b has an overall thickness of between 3000Å–5000Å, preferably about 4000Å. Thereby, a relatively thick insulator structure is formed on the epitaxial layer 23 in correspondence to the source region 28a and the drain region 28b. Further, the SOG is applied on the top surface of the second insulator film 24b in the liquid state by a spin coating process so that any depression formed on the top surface of the insulator film 24b is filled by the SOG. Further, the second insulator film 24b is cured at a temperature of 800° C. for example, and an SOG layer 32 is formed on the top surface of the insulator film 24b. It should be noted that, in this step of the fabrication process, the through hole corresponding to the through hole 13 is not provided, and therefore, the problem that the through hole provided on the insulator film 24b and 24 is unwantedly filled by SOG is positively eliminated.

Next, in a step of FIG. 2I, a contact hole 33 corresponding to the contact hole 13 of FIG. 1F is formed through the insulator layers 32 and 24b as well as through the polysilicon base electrode 26b such that the top surface of the epitaxial layer 23 is exposed at the bottom of the contact hole 13. Further, the exposed side wall of the base electrode 26b corresponding to the through hole 33 is covered by a thin oxide film (not illustrated) which may be formed by a thermal oxidation process or by a CVD process, and an ion implantation for forming the inner base region 27 is made through the hole 33.

Next, in a step of FIG. 2J, another insulator film 43 of silicon oxide is deposited uniformly over the structure of FIG. 2J thus formed including the through hole 33 with a thickness of about 1000Å by the CVD process, and another polysilicon layer $26_1$ is deposited further thereon with a thickness of about 1000 Å also by the CVD process. Thereby, the insulator film 43 and the polysilicon layer $26_1$ cover the side wall and the bottom of the through hole 33 in conformity with the contour of the through hole 33 as shown in the structure shown in FIG. 2J. In this state, the bottom of the through hole 33 is closed and the through hole 33 is no longer a real through hole.

Next, in a step of FIG. 2K, an anisotropic etching process acting perpendicularly to the plane of the epitaxial layer 23 is applied further such that the insulator film 43 is removed except for those remaining in the hole 33. In the hole 33, the anisotropic etching process proceeds vertically to the bottom of the hole 33 and stops when the top surface of the epitaxial layer 23 is exposed. Thereby, there is formed a second through hole 33' exposing the top surface of the epitaxial layer 23 as illustrated in FIG. 23K. It should be noted that the second through hole 33' has a diameter substantially smaller than that of the hole 33.

Next, in a step of FIG. 2L, another polysilicon layer (not shown) is deposited on the structure of FIG. 2K and impurities such as arsenic or phosphorus for doping silicon to the n-type are introduced by ion implantation. Further, the polysilicon layer is patterned and the emitter electrode 26c doped to the n+-type is formed. The impurities thus introduced are diffused into the epitaxial layer 23 as a result of the annealing process following the ion implantation process. As a result, the emitter region 30 is formed at the top surface part of the epitaxial layer 23. After, the emitter region 30 is formed, contact holes are provided through the insulator films 24 and 24a as well as the layer 32 by an anisotropic etching process in correspondence to the source region 28a, the drain region 28b, the collector contact 25, the base electrode 26b, and interconnection electrodes 31a-31e of aluminum or aluminum alloy are provided respectively in correspondence to the source of the MOS transistor, the drain of the MOS transistor, the collector of the bipolar transistor, the emitter of the bipolar transistor, and the base of the bipolar transistor. It should be noted that the electrode 31d for the emitter is provided directly on the emitter electrode and there is no need to form the contact hole for the electrode 31d. Thereby, the structure shown in FIG. 2L is completed.

According to the present invention, the hole 33 for the emitter is provided after the planarization of the device by the SOG is completed, and thus, the problem that the hole 33 may be filled by SOG is entirely eliminated. Thereby, the need for removing SOG from the hole 33 is eliminated entirely and associated therewith, the etching for providing the contact holes for the electrodes 11a-11e can be performed without causing the contact holes for the electrodes 11a and 11b to extend excessively into the diffusion region 28a, 28b. The structure of FIG. 2L should be compared with the structure of FIG. 1J. Further, associated with the elimination of the etching process for removing the SOG from the hole 33, the risk that the interconnection electrode 31d may be contacted with the base electrode 26b due to the deep etching which would be necessary when the hole 33 is formed previously to the planarization is entirely eliminated, and an excellent insulation can be obtained between the interconnection electrode 31d and base electrode 26b.

Further, in the process of the present invention, a thick insulator structure comprising at least the insulator film 24 and the insulator film 24b is provided on the source region 28a and the drain region 28b of the MOS transistor and the risk that the insulator structure may be damaged when a current is caused to flow through the interconnection electrodes 31a and 31b is substantially reduced. Thereby the reliability of the semiconductor device is improved.

Furthermore, as the diffusion process for forming the emitter region 30 is performed after most of the device structure (FIG. 2K) is completed, the diffusion of the impurities in the epitaxial layer 23 to form the emitter region 30 is controlled relatively easily and the thickness of the emitter region 30 can be controlled exactly. Thereby the thickness of the inner base region 27 can be reduced without risking that the emitter region 30 may penetrate through the base region 27 and reach the collector region underneath, and the operational speed of the bipolar transistor can be maximized.

Further, there is another advantage in that, as the planarization process using the SOG is already completed before the hole 33 is formed, one can apply the SOG a number of times during the process, for example in each of the steps of FIGS. 2C-2F, and thereby a near-ideal planarization can be achieved. With such a near-ideal planarization, the reliability of the semiconductor device is significantly improved.

Although the present invention is described so far with reference to the case in which the MOS transistor is the p-channel type and the bipolar transistor is the npn-transistor, the combination of the n-channel MOS transistor and the pnp-transistor can also be obtained by simply inverting the conduction type of the diffusion regions.

Further, the timing and method of introducing the impurities are not limited to those as shown and explained. For example, the impurities for the outer base region 27a may be performed before the base electrode 26b is formed by the patterning of the polysilicon layer 26.

Further, the present invention is not limited to these embodiments described heretofore but various variations and modifications may be made without departing from the scope of the invention.

What is claimed is:

1. A method for fabricating a semiconductor device including a metal-insulator-semiconductor transistor and a bipolar transistor on a common semiconductor layer respectively in correspondence to a first region and a second region defined in the semiconductor layer, said first region and said second region being formed along a surface of the semiconductor layer with a mutual separation therebetween, said method comprising the steps of:

forming a first insulator layer on the semiconductor layer in correspondence to the first region;

providing a gate electrode of the metal-insulator-semiconductor transistor on the first insulator layer in correspondence to the first region of the semiconductor layer;

providing a base electrode on the second region of the semiconductor layer;

introducing impurities into the semiconductor layer in the first region using the gate electrode as a mask to form a self-aligned source region and drain region in the semiconductor layer at both sides of the gate electrode;

introducing impurities into the base electrode and causing a diffusion of the impurities into the semiconductor layer from the base electrode to form a base region in the second region of the semiconductor layer;

providing a second insulator layer so as to cover the first region including the source region, the gate electrode and the drain region, and the second region including the base electrode;

providing an insulator material on the second insulator in the form of liquid and curing subsequently to form a third insulator layer on the second insulator layer with a planarized top surface;

providing a through hole in the second insulator layer in correspondence to the second region of the semiconductor layer, after the step of providing the insulator material forming the third insulator layer, such that the through hole penetrates at least through the second insulator layer and the base electrode to expose a top surface of the semiconductor layer;

forming an emitter region of the bipolar transistor in the second region of the semiconductor layer in correspondence to the top surface of the semiconductor layer exposed by the through hole; and providing interconnection electrodes for interconnection of the semiconductor device in correspondence to the source region and the drain region of the MOS transistor and further in correspondence to the base region and the emitter region of the bipolar transistor.

2. A method as claimed in claim 1 in which said step of introducing the impurities to form the source and drain regions is performed simultaneously to the step of introducing the impurities into the base electrode.

3. A method as claimed in claim 2 in which said step of introducing impurities into the semiconductor layer and said step of introducing impurities into the base electrode are performed by ion implantation.

4. A method as claimed in claim 1 in which said step of forming the emitter region comprises the steps of introducing the impurities into the semiconductor layer through the through hole to form the emitter region, and providing an emitter electrode in said through hole, wherein said step of providing the interconnection electrode comprises a step of depositing a conductor material forming the interconnection electrode in contact with the emitter electrode.

5. A method as claimed in claim 1 further comprises, after the step of forming the emitter region, the steps of depositing an insulator material on the semiconductor layer via the through hole to form a layer of the insulator material, providing a second through hole in the layer of the insulator material to expose a part of the semiconductor layer underneath the first through hole, and depositing the emitter electrode in contact with the exposed part of the semiconductor layer.

6. A method as claimed in claim 1 in which said step of providing the insulator material to form the planarized top surface comprises a step of providing a spin-on-glass layer by a spin coating process.

* * * * *